(12) United States Patent
Narasimman et al.

(10) Patent No.: US 10,819,366 B1
(45) Date of Patent: Oct. 27, 2020

(54) DELTA SIGMA MODULATOR FOR AND METHOD OF GENERATING A DIGITAL OUTPUT VOLTAGE

(71) Applicants: Agency for Science, Technology and Research, Singapore (SG); Nanyang Technological University, Singapore (SG)

(72) Inventors: Neelakantan Narasimman, Singapore (SG); Dipankar Nag, Singapore (SG); Kevin Tshun Chuan Chai, Singapore (SG); Tae Hyoung Kim, Singapore (SG)

(73) Assignees: Agency for Science, Technology and Research, Singapore (SG); Nanyang Technological University, Singapore (SG)

( * ) Notice: Subject to any disclaimer, the term of this patent is extended or adjusted under 35 U.S.C. 154(b) by 177 days.

(21) Appl. No.: 16/305,142

(22) PCT Filed: May 24, 2017

(86) PCT No.: PCT/SG2017/050269
§ 371 (c)(1),
(2) Date: Nov. 28, 2018

(87) PCT Pub. No.: WO2017/209690
PCT Pub. Date: Dec. 7, 2017

(30) Foreign Application Priority Data

Jun. 1, 2016 (SG) .............................. 10201604413S

(51) Int. Cl.
*H03M 3/00* (2006.01)
*G01R 27/26* (2006.01)

(52) U.S. Cl.
CPC ........ *H03M 3/458* (2013.01); *G01R 27/2605* (2013.01)

(58) Field of Classification Search
CPC .......... H03M 1/00; H03M 1/12; H03M 3/434; H03M 3/458; H03M 7/30; H03M 1/123;
(Continued)

(56) References Cited

U.S. PATENT DOCUMENTS 5,995,036 A 11/1999 Nise et al.
6,516,772 B2 2/2003 Ueno et al.
(Continued)

OTHER PUBLICATIONS

Jung et al., "A 0.7pF-to-10nF Fully Digital Capacitance-to-Digital Converter Using Iterative Delay-Chain Discharge," 2015 IEEE International, ISSCC, Feb. 25, 2015, pp. 484-485.
(Continued)

*Primary Examiner* — Linh V Nguyen
(74) *Attorney, Agent, or Firm* — Winstead PC

(57) ABSTRACT

Various embodiments may provide a delta sigma modulator for generating a digital output voltage. The delta sigma modulator may include a capacitance-to-voltage converter for converting a sensed continuous-in-time applied capacitance signal to a delta analog output voltage signal. The modulator may also include an integrator circuit arrangement configured to generate an analog output voltage signal based on the delta analog output voltage signal. The modulator may additionally include a quantizer circuit arrangement configured to generate the digital output signal based on the analog output voltage signal. The modulator may further include a voltage digital-to-analog converter configured to generate the analog charging voltage based on the digital output signal, thereby generating the delta analog output voltage signal based on the digital output signal.

20 Claims, 12 Drawing Sheets

(58) Field of Classification Search
CPC .......... H03M 3/34; H03M 3/394; H03M 3/43; H03M 3/484; H03M 3/486
USPC ................................................. 341/143, 172
See application file for complete search history.

(56) References Cited

U.S. PATENT DOCUMENTS

| | | | |
|---|---|---|---|
| 6,954,159 B1 | 10/2005 | Cooper et al. | |
| 7,324,029 B2* | 1/2008 | Wang | ........................ G01L 9/12 324/658 |
| 8,547,114 B2 | 10/2013 | Kremin | |
| 2002/0026921 A1 | 3/2002 | Ueno et al. | |
| 2005/0206543 A1 | 9/2005 | Draxelmayr | |
| 2007/0236373 A1* | 10/2007 | Hellwig | ................... G01D 5/24 341/143 |
| 2008/0191713 A1* | 8/2008 | Hauer | ................... H03M 3/496 324/658 |
| 2010/0194615 A1* | 8/2010 | Lu | ........................ H03M 3/454 341/155 |
| 2011/0057826 A1* | 3/2011 | Peng | ..................... H03M 1/002 341/155 |
| 2012/0112817 A1 | 5/2012 | Guedon et al. | |
| 2015/0295587 A1 | 10/2015 | Garcia Gonzalez et al. | |
| 2016/0265995 A1* | 9/2016 | Wang | ........................ G01D 5/24 |
| 2017/0023429 A1* | 1/2017 | Straeussnigg | ......... H03L 7/0891 |
| 2018/0226929 A1* | 8/2018 | Kamath | ................ H03F 3/4508 |
| 2018/0337684 A1* | 11/2018 | Rogi | ........................ H03M 1/56 |

OTHER PUBLICATIONS

Oh et al., "15.4b Incremental Sigma-Delta Capacitance-to-Digital Converter with Zoom-In 9b Asynchronous SAR," VLSI Circuits Digest of Technical Papers, 2014, pp. 1-2.

He et al., "A 0.05mm2 1V Capacitance-to-Digital Converter Based on Period Modulation," 2015 IEEE International, ISSCC, Feb. 25, 2015, pp. 486-487.

Tan et al., "A 1.2-V 8.3-nJ CMOS Humidity Sensor for RFID Applications," IEEE Journal of Solid-State Circuits, vol. 48, No. 10, Oct. 2013, p. 2469-2477.

Xia et al., "A Capacitance-to-Digital Converter for Displacement Sensing with 17b Resolution and 20 μs Conversion Time," 2015 IEEE International, ISSCC, Feb. 25, 2012, pp. 198-200.

Omran et al., "A Robust Parasitic-Insensitive Successive Approximation Capacitance-to-Digital Converter," CICC, 2014, pp. 1-4.

V., Sreenath, "A Novel Switched-Capacitor Capacitance-to-Digital Converter for Single Element Capacitive Sensors," 2015 IEEE International Instrumentation and Measurement Technology Conference (I2MTC), May 14, 2015, pp. 381-386.

Noel, Philip V., "Switched Capacitor Single-Slope Capacitance to Direct Digital Converter for Differential Capacitive Sensors," IEEE First International Conference on Control, Measurement and Instrumentation (CMI), Jan. 10, 2016, pp. 239-243.

International Preliminary Report on Patentability for International Application No. PCT/SG2017/050269 dated Apr. 26, 2018, pp. 1-23.

Written Opinion of the International Searching Authority for International Application No. PCT/SG2017/050269 dated Jul. 7, 2017, pp. 1-6.

* cited by examiner

**SNDR
113dB**

| Parameter | Proposed modulator | [1] | [2] | [3] | [4] | [5] |
|---|---|---|---|---|---|---|
| Year/Publication | 2016 | 2015/ISSCC | 2014/VLSIC | 2015/ISSCC | 2013/JSSCC | 2012/ISSCC |
| Description | CT ΔΣM | Iterative delay line discharge | 2nd order DT-ΔΣ + SAR | Period Modulation | 3rd order DT-ΔΣ | 3rd order DT-ΔΣ |
| Process/Technology | 0.18um | 40nm | 0.18um | 0.16um | 0.16um | 0.35um |
| Input range | 0-10pF | 0.7pF-10nF | 0-24pF | 0-8pF | 0.54-1.06pF | NA |
| Resolution (aF) | 215 | 12300 | 160aF | 255 | 75aF | 65aF |
| ENOB | 14 | 9 | 15.4 | 13.1 | 12.5 | 17.2 |
| Measurement Time | 125us | 19us | 230us | 6.86ms | 800uS | 20us |
| Power | 48uW | 1.84uW | 33.7uW | 14uW | 10.3uW | 15mW |
| Figure of Merit (FoM) (fJ/Conv) | 440 | 141 | 175 | 10600 | 3900 | 5515 |
| FoM (Schreier) (dB) | 178.26 | 170.5 | 185.57 | 160.8 | 167.85 | 180 |

FIG. 8B

| Key Parameters | Proposed | Michigan | Delft | Michigan | Kaust |
|---|---|---|---|---|---|
| Year | 2015 | 2015 | 2013 | 2014 | 2014 |
| Product/Publication | NA | ISSCC 2015 | JSSC 2013 | VLSI 2014 | CICC 2014 |
| Description | Continuous time Sigma delta with VCO quantizer | Iterative delay line discharge | SC Sigma delta | SC Sigma delta + SAR | SAR |
| Process Technology | 0.18um | 40nm | 0.16um | 0.18um | 0.35um |
| Input range | 0-10pF | 0.7pF – 10nF | 0.54-1.06pF | 0-24pF | 16p |
| Resolution | 100aF | 12.3fF | 75aF | 160aF | NR |
| ENOB | 15 | 9 | 12.5 | 15.4 | 12.5 |
| Measurement Time | 0.125mS | 19.06uS | 0.8mS | 0.23mS | 0.65m |
| Power | 48uW* | 1.84uW | 10.3uW | 33.7uW | 300u |
| FOM (pJ/CS) | 0.183* | 0.141 | 3.9 | 0.175 | 34 |

800b

DELTA SIGMA MODULATOR FOR AND METHOD OF GENERATING A DIGITAL OUTPUT VOLTAGE

CROSS-REFERENCE TO RELATED APPLICATION

This application claims the benefit of priority of Singapore application No. 10201604413S filed on Jun. 1, 2016, the contents of it being hereby incorporated by reference in its entirety for all purposes.

TECHNICAL FIELD

Various aspects of this disclosure relate to delta sigma modulators for generating digital output voltages. Various aspects of this disclosure relate to methods of generating digital output voltages.

BACKGROUND

Capacitive sensors are based on the modulation of electrical capacitance by a physical or chemical parameter of interest. This principle is widely used, for instance in pressure sensors, liquid level gauges, accelerometers, and humidity sensors. Since capacitive sensors do not consume static power, they are very suitable for use in low-power and energy-constrained applications, such as battery-powered systems and wireless sensor networks. However, in such applications, the energy consumption of the capacitive sensor would be dominated by the interface circuit that converts capacitance values to the digital domain. Hence, for such applications, an energy-efficient capacitive-sensor interface is crucial. Recently, there has been lot of focus on ultra-low power energy efficient capacitive sensing based on novel techniques. However, the resolution of most of the designs is limited by the architecture. Period modulation is one technique used to achieve higher resolution. However, the need for a high-resolution time reference decreases the overall power efficiency of the system.

Delta sigma ($\Delta\Sigma$) modulation is a popular technique when high resolution is desired. There are several publications describing capacitance-to-digital convertors (CDC) using $\Delta\Sigma$ modulators. Some CDCs may use discrete-time $\Delta\Sigma$ modulators (DT-$\Delta\Sigma$M). However, there are two main disadvantages of this technique. The sampling operation at the input of the DT-$\Delta\Sigma$M may cause noise folding, resulting in increased thermal noise (KTC noise) and reducing signal-to-noise ratio (SNR). In addition, these modulators employ sensing capacitors as the sampling capacitors. Hence, there are charging and discharging of large off-chip and parasitic capacitors at the same rate as the sampling frequency, which consumes additional energy.

SUMMARY

Various embodiments may provide a delta sigma modulator. The delta sigma modulator may be for generating a digital output voltage. The delta sigma modulator may include a capacitance-to-voltage converter for converting a sensed continuous-in-time applied capacitance signal to a delta analog output voltage signal. The converter may include an amplifier having a first input, a second input, and an output. The converter may further include a feedback capacitor with a first end coupled to the first input of the amplifier, and a second end coupled to the output. The converter may also include a sensor element with a first end coupled to the first input of the amplifier, and a second end for coupling to a first reference voltage, the sensor element for sensing an external input to generate the continuous-in-time applied capacitance signal. The converter may further include a reference capacitor with a first end coupled to the first input of the amplifier, and a second end for coupling to a second reference voltage. The reference capacitor may have a reference capacitance. The converter may additionally include a switch capacitor arrangement with a first end coupled to the first input of the amplifier, and a second end. The switch capacitor arrangement may be configured to have a charge capacitance based on an analog charging voltage. The converter may also include a switching mechanism configured to switch the second end of the switch capacitor arrangement, between the second end of the sensor element so that the switch capacitor arrangement is in parallel connection with the sensor element, and the second end of the reference capacitor so that the switch capacitor arrangement is in parallel connection with the reference capacitor. The switching may be based on the charge capacitance relative to the applied capacitance signal and the reference capacitance. The switching may adjust a first voltage signal at the first input of the amplifier relative to a second voltage signal at the second input of the amplifier, thereby adjusting the delta analog output voltage signal generated at the output. The modulator may further include an integrator circuit arrangement configured to generate an analog output voltage signal based on the delta analog output voltage signal. The modulator may also include a quantizer circuit arrangement configured to generate the digital output signal based on the analog output voltage signal. The modulator may further include a voltage digital-to-analog converter configured to generate the analog charging voltage based on the digital output signal, thereby generating the delta analog output voltage signal based on the digital output signal.

Various embodiments may provide a method of generating a digital output voltage or a method of operating a delta sigma modulator. The method may include converting a sensed continuous-in-time applied capacitance signal to a delta analog output voltage signal using a capacitance-to-voltage converter. The converter may include an amplifier having a first input, a second input, and an output. The converter may also include a feedback capacitor with a first end coupled to the first input of the amplifier, and a second end coupled to the output. The converter may further include a sensor element with a first end coupled to the first input of the amplifier, and a second end for coupling to a first reference voltage, the sensor element for sensing an external input to generate the continuous-in-time applied capacitance signal. The converter may additionally include a reference capacitor with a first end coupled to the first input of the amplifier, and a second end for coupling to a second reference voltage, the reference capacitor having a reference capacitance. The converter may also include a switch capacitor arrangement with a first end coupled to the first input of the amplifier, and a second end, the switch capacitor arrangement configured to have a charge capacitance based on an analog charging voltage. The converter may further include a switching mechanism configured to switch the second end of the switch capacitor arrangement, between the second end of the sensor element so that the switch capacitor arrangement is in parallel connection with the sensor element, and the second end of the reference capacitor so that the switch capacitor arrangement is in parallel connection with the reference capacitor. The switching may be based on the charge capacitance relative to the applied capacitance and the reference capacitance. The switching may adjust a first voltage signal at the first input of the amplifier relative to a second voltage signal at the second input of the amplifier, thereby adjusting the delta analog output voltage signal generated at the output. The method may also include generating an analog output voltage signal based on the delta analog output voltage signal using an integrator circuit arrangement. The method may additionally include generating the digital output signal based on the analog output voltage signal using a quantizer circuit arrangement. The analog charging voltage may be generated based on the digital output signal using a voltage digital-to-analog converter, thereby generating the delta analog output voltage signal based on the digital output signal.

BRIEF DESCRIPTION OF THE DRAWINGS

The invention will be better understood with reference to the detailed description when considered in conjunction with the non-limiting examples and the accompanying drawings, in which:

FIG. 8A is a table comparing the performance parameters of the modulator according to various embodiments with the performance parameters of conventional devices.

FIG. 8B is another table comparing the performance parameters of the modulator according to various embodiments with the performance parameters of conventional devices.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or one of the modulators/converters/devices is analogously valid for the other methods or modulators/converters/devices. Similarly, embodiments described in the context of a method are analogously valid for a modulator/converter/device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Continuous-time ΔΣ modulators (CT-ΔΣM) on the other hand do not have this problem as the sampling is performed just before the quantization. However, existing continuous-time ΔΣ modulators require an additional capacitance-to-voltage converter (CVC), which increases power consumption.

Figure 1:
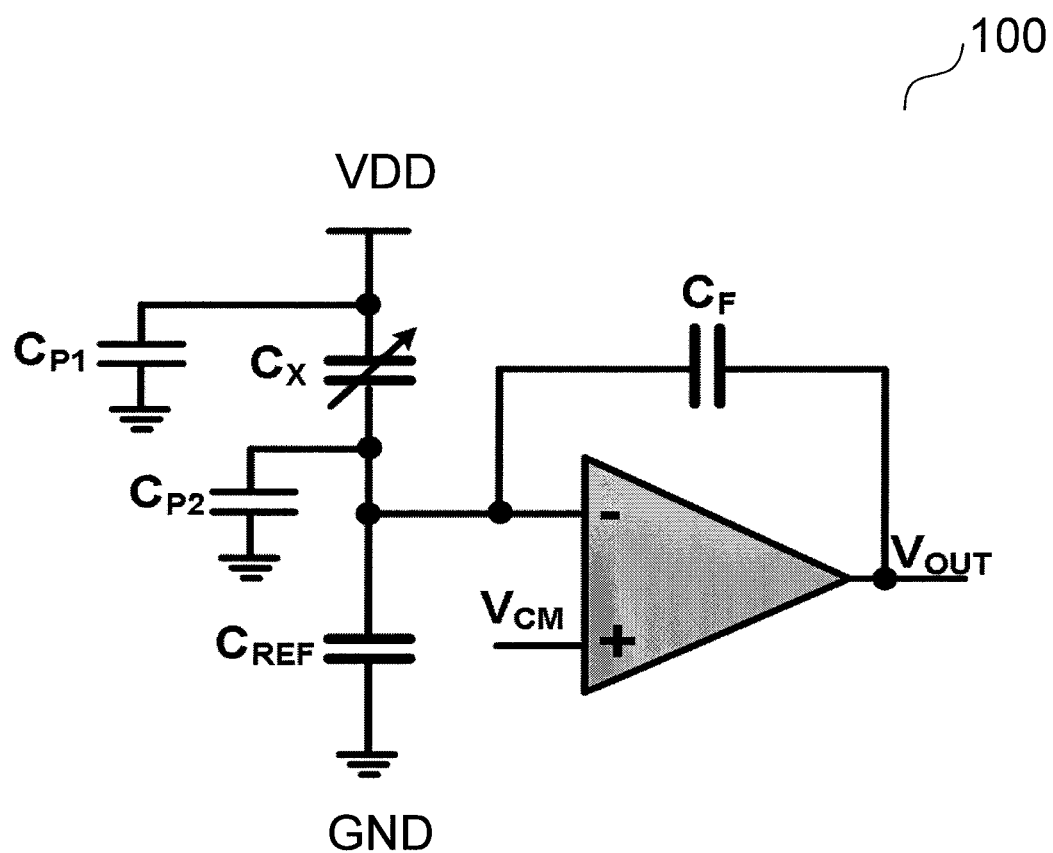
FIG. 1 is a schematic of a capacitance to voltage converter (CVC).

FIG. 1 is a schematic of a capacitance to voltage converter (CVC) 100. $C_X$ may be the sensor capacitor and $C_{REF}$ may be a reference capacitance connected in series between a predetermined non-zero voltage (VDD) and ground (GND). $C_{REF}$ may be selected to cancel out the minimum rest capacitance of sensor. $C_F$ may be the feedback capacitor and $C_{P1}$ and $C_{P2}$ may be parasitic capacitances associated with sensor capacitor plates. The virtual ground may be set to $V_{CM}$. The readout process may then extract charge proportional to difference between $C_X$ and $C_{REF}$ and may store the charge difference on $C_F$. If $V_{OUT}$ is the voltage at the output of amplifier, by virtue of charge balancing it can be shown that $$V_{OUT} = ((C_{REF} - C_X)/C_F) * VDD/2 \qquad (1)$$

As such, the voltage at the output of the amplifier may be indicative of the sensor capacitance value.

Various embodiments may provide an improved delta-sigma modulator, which may have advantages over conventional delta-sigma modulators, and/or which may address one or more issues faced by conventional delta-sigma modulators. Various embodiments may have lower power consumption, lower thermal noise, and/or higher signal-to-noise ratio compared to conventional devices.

In various embodiments, the delta-sigma modulator may be a continuous-time delta-sigma modulator (CT-ΔΣM) that embeds a capacitance-to-voltage converter (CVC) inside the sigma-delta loop, thereby improving energy efficiency. Various embodiments may include a voltage controlled oscillator-based (VCO-based) integrator as the second stage, which performs multi-bit quantization that alleviates the biasing current requirements for the operational transconductance amplifiers (OTAs) used.

Figure 2:
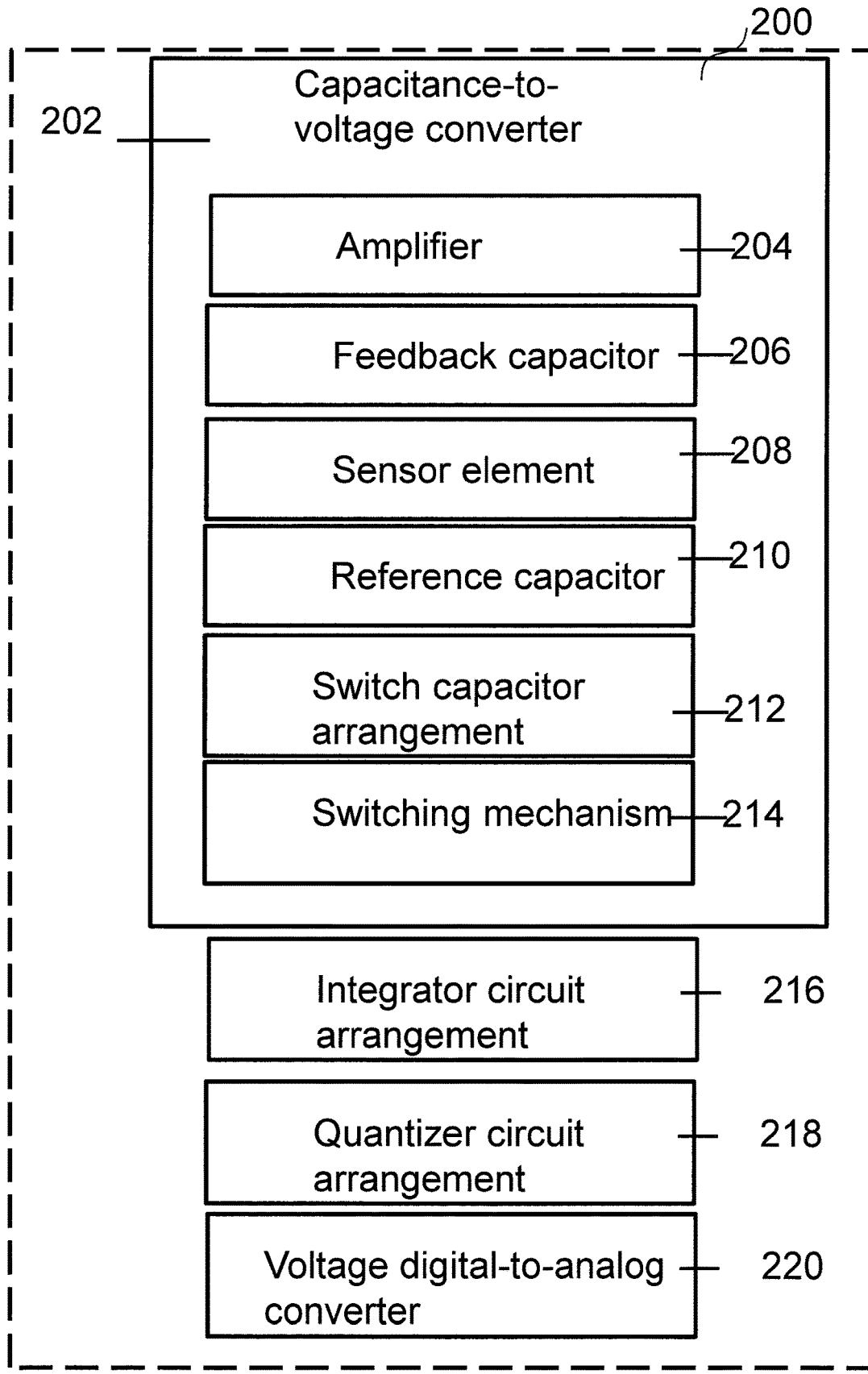
FIG. 2 is a general schematic of a delta sigma modulator according to various embodiments.

FIG. 2 is a general schematic of a delta sigma modulator 200 according to various embodiments. The delta sigma modulator 200 may be for generating a digital output voltage. The delta sigma modulator 200 may include a capacitance-to-voltage converter 202 for converting a sensed continuous-in-time applied capacitance signal to a delta analog output voltage signal. The converter 202 may include an amplifier 204 having a first input, a second input, and an output. The converter 204 may further include a feedback capacitor 206 with a first end coupled to the first input of the amplifier 204, and a second end coupled to the output. The converter 202 may also include a sensor element 208 with a first end coupled to the first input of the amplifier 204, and a second end for coupling to a first reference voltage, the sensor element 208 for sensing an external input to generate the continuous-in-time applied capacitance signal. The converter 202 may further include a reference capacitor 210 with a first end coupled to the first input of the amplifier 204, and a second end for coupling to a second reference voltage. The reference capacitor 210 may have a reference capacitance. The converter 202 may additionally include a switch capacitor arrangement 212 with a first end coupled to the first input of the amplifier 204, and a second end. The switch capacitor arrangement 212 may be configured to have a charge capacitance based on an analog charging voltage. The converter 202 may also include a switching mechanism 214 configured to switch the second end of the switch capacitor arrangement 212, between the second end of the sensor element 208 so that the switch capacitor arrangement 212 is in parallel connection with the sensor element 208, and the second end of the reference capacitor 210 so that the switch capacitor arrangement 212 is in parallel connection with the reference capacitor 210. The switching may be based on the charge capacitance relative to the applied capacitance signal and the reference capacitance. The switching may adjust a first voltage signal at the first input of the amplifier 204 relative to a second voltage signal at the second input of the amplifier 204, thereby adjusting the delta analog output voltage signal generated at the output.

The modulator 200 may further include an integrator circuit arrangement 216 configured to generate an analog output voltage signal based on the delta analog output voltage signal. The modulator 200 may also include a quantizer circuit arrangement 218 configured to generate the digital output signal based on the analog output voltage signal. The modulator 200 may further include a voltage digital-to-analog converter 220 configured to generate the analog charging voltage based on the digital output signal, thereby generating the delta analog output voltage signal based on the digital output signal.

In other words, the delta sigma modulator 200 may include a capacitance-to-voltage converter 202 configured to generate a continuous-in-time applied capacitance signal based on an external input, and may further configured to convert the continuous-in-time applied capacitance signal into a delta analog output voltage signal. The delta sigma modulator may further include an integrator circuit arrangement 216 coupled to the capacitance-to-voltage converter 202 and a quantizer circuit arrangement 218 coupled to the integrator circuit arrangement 216 to generate a digital output. The delta sigma modulator 200 may also include a voltage digital-to-analog converter 220 arranged along a feedback loop to couple the quantizer circuit arrangement 218 and the capacitance-to-voltage converter 202.

The delta sigma modulator 200 may be or may be included in a capacitance-to-digital (CDC) converter.

Figure 3:
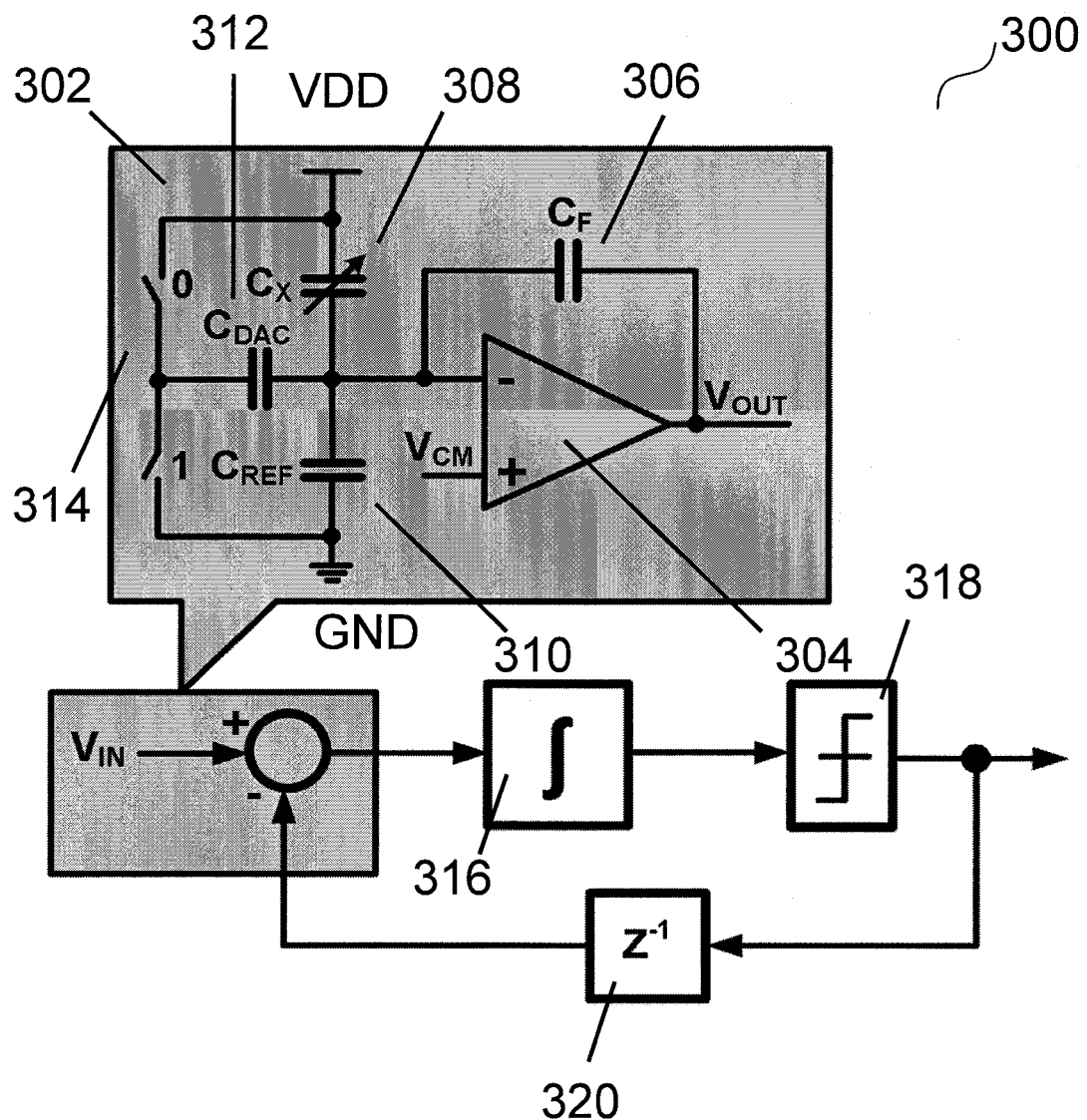
FIG. 3 is a schematic of a continuous-time delta sigma modulator (CT-ΔΣ) according to various embodiments.

FIG. 3 is a schematic of a continuous-time delta sigma modulator 300 (CT-ΔΣ) according to various embodiments. The delta sigma modulator 300 may include an embedded capacitance-to-voltage converter 302 (CVC).

A modulator that follows the CVC 100 shown in FIG. 1, may be used for digitizing the sensor capacitance. However, such an implementation may not be energy efficient as both CVC and first integrator of the CT-ΔΣ modulator need to meet noise requirements.

Alternatively, the CVC may be modified to be embedded inside the CT-ΔΣM 300 as shown in FIG. 3. For simplicity, a one bit quantizer 318 and digital-to-analog converter (DAC) 320 is shown in FIG. 3. A switch capacitor 312, $C_{DAC}$, may be used to feedback the output. One end of capacitor 312 may be tied to the floating node and other end may be switched between VDD and GND depending on the previous output using a switching arrangement 314, e.g. including one or two switches. The switching arrangement 314 when set to 0, may connect capacitor 312 to sensor element 308, i.e. capacitor $C_X$, and when set to 1, may connect capacitor 312 to reference capacitor 310, i.e. $C_{REF}$. This may in turn balance the charge for all the capacitances connected to virtual ground. With every switching, capacitor 312 may be charged or discharged depending on the previous amount of charge held by the capacitor 312. Hence, the amount of charge pumped in or out by $C_{DAC}$ for every switching is $\pm C_{DAC}*VDD$. By virtue of this charge balancing, the output of the amplifier 304 may be modified from Equation (1) as follows:

$$V_{OUT}=[(C_{REF}-C_X \pm 2*C_{DAC})/C_F]*VDD/2 \qquad (2)$$

If $2*C_{DAC}$ corresponds to the quantized value of $C_X$ from the previous sampling interval, then the circuit 302 in FIG. 3 may perform the delta operation in a ΔΣ modulator 300. Thus, the circuit 302 embedded in a ΔΣ loop may form a CT-ΔΣ modulator. The value of capacitance of feedback capacitor ($C_F$) 306 may set the gain of the CVC 302.

In other words, the delta sigma modulator 300 shown in FIG. 3 may include a capacitance-to-voltage converter 302 for converting a sensed continuous-in-time applied capacitance signal to a delta analog output voltage signal. The converter 302 may include an amplifier 304 having a first input, a second input, and an output. The converter 304 may further include a feedback capacitor 306 with a first end coupled to the first input of the amplifier 304, and a second end coupled to the output (of the amplifier 304). The converter 302 may further include a sensor element 308, e.g. a sensing capacitor, with a first end coupled to the first input of the amplifier 304, and a second end for coupling to a first reference voltage (e.g. VDD), the sensor element 308 for sensing an external input to generate the continuous-in-time applied capacitance signal. The converter 308 may additionally include a reference capacitor 310 with a first end coupled to the first input of the amplifier 304, and a second end for coupling to a second reference voltage (e.g. GND), the reference capacitor 310 having a reference capacitance. The converter 302 may also include a switch capacitor arrangement 312 (the switch capacitor arrangement 312 including a capacitor) with a first end coupled to the first input of the amplifier 304, and a second end. The switch capacitor arrangement 312 may be configured to have a charge capacitance based on an analog charging voltage. The converter 302 may further include a switching mechanism 314 (including one, two or more switches) configured to switch the second end of the switch capacitor arrangement 314, between the second end of the sensor element 308 so that the switch capacitor arrangement 314 is in parallel connection with the sensor element 308, and the second end of the reference capacitor 310 so that the switch capacitor arrangement 312 is in parallel connection with the reference capacitor 310. The switching (in the current time interval) may be based on the charge capacitance relative to the applied capacitance signal and the reference capacitance (of a previous or preceding time interval). The switching may adjust a first voltage signal at the first input of the amplifier relative to a second voltage signal at the second input of the amplifier, thereby adjusting the delta analog output voltage signal generated at the output.

The delta analog output voltage signal generated at the output of the capacitance-to-voltage converter 302 may alternatively be referred to as CVC output signal.

The modulator 300 may further include an integrator circuit arrangement or integrator 316 configured to generate an analog output voltage signal based on the delta analog output voltage signal. The modulator 300 may also include a quantizer circuit arrangement or quantizer 318 configured to generate the digital output signal based on the analog output voltage signal. The modulator 300 may further include a voltage digital-to-analog converter 320 configured to generate the analog charging voltage based on the digital output signal, thereby generating the delta analog output voltage signal based on the digital output signal. The second input of the amplifier 304 may be configured to receive a common mode voltage.

A larger gain of the CVC 302 may alleviate the noise requirements of the integrator 316 that follows the CVC 302. Thus choosing the right value of $C_F$ 306 may make the proposed architecture energy efficient.

In various embodiments, a large resistor, in the order of few gigaohms (GΩ), may be used to set the direct current (DC) bias at the input of the amplifier, and feedback capacitor may form a high-pass filter at the input of the amplifier with a cut-off frequency in the range of few tens of Hz. This may increase the in-band quantization noise in a ΔΣ loop. To mitigate this problem, the capacitive input signal and in-band quantization noise may have to be chopped to a higher frequency. At the output of CVC, chopping may be done to demodulate the signal back to base band.

Figure 4A:
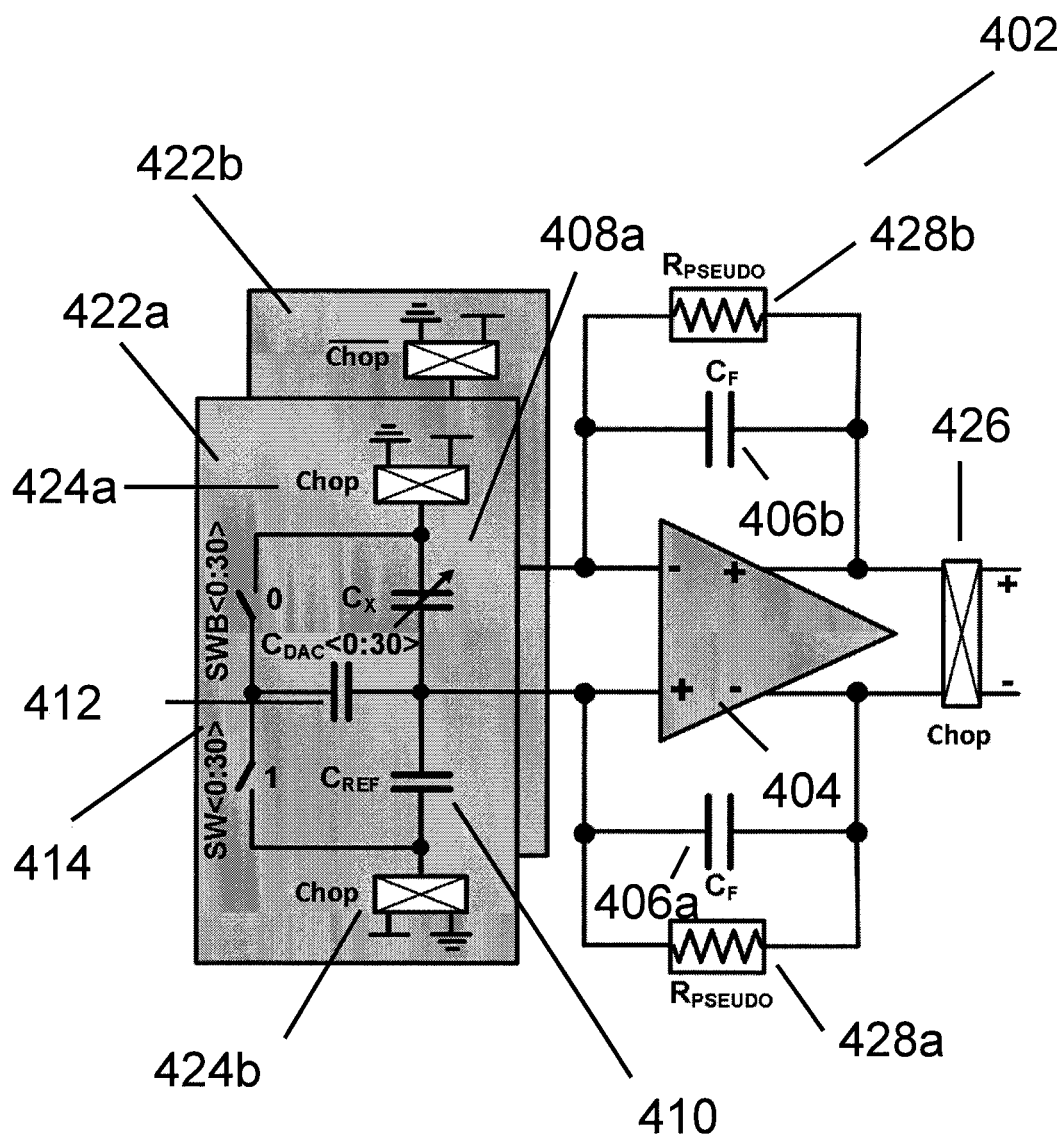
FIG. 4A is a schematic showing a capacitance-to-voltage converter according to various embodiments.

FIG. 4A is a schematic showing a capacitance-to-voltage converter 402 according to various embodiments. The converter 402 may include step-up input choppers 424a, 424b, and output step-down chopper 426. Adding reference chopping may also be beneficial in dealing with offset and flicker noise of the operational amplifier 404 (op-amp). This may reduce or eliminate the need for additional chopping for handling op-amp noise. The chopping frequency may be chosen to be larger than the flicker corner of the operational amplifier 404. At every chopping instance, the delay offered by the operational amplifier 404 may result in a glitch at the output of CVC 402. This may reduce the SNR of the overall CDC. Hence, careful analysis may be required in choosing the chopping frequency. In one implementation, a chopping frequency of 16 KHz may be used.

The converter 402 may include a first switching circuit 422a including the reference capacitor 410, the switch capacitor arrangement 412, and the switching mechanism 414. The switch capacitor arrangement 412 may include one or more switching capacitors. The switching mechanism may include one, two or more switches. The converter 402 may include a second switching circuit 422b including the further reference capacitor, the further switch capacitor arrangement, and the further switching mechanism. The further reference capacitor, the further switch capacitor arrangement, and the further switching mechanism are hidden from view in FIG. 4A. The first switching circuit 422a and the second switching circuit 422b may be substantially identical or similar. The further switch capacitor arrangement 422b may include one or more further switching capacitors. The further switching mechanism may include one, two or more further switches.

The capacitance-to-voltage converter 402 may include an amplifier 404 having a first input, a second input, and an output. The converter 402 may further include a feedback capacitor 406a with a first end coupled to the first input of the amplifier 404, and a second end coupled to the output. The converter 402 may further include a sensor element 408a, e.g. a sensing capacitor, with a first end coupled to the first input of the amplifier 404, and a second end for coupling to a first reference voltage, the sensor element 408a for sensing an external input to generate the continuous-in-time applied capacitance signal. The converter 404 may additionally include a reference capacitor 410 with a first end coupled to the first input of the amplifier 404, and a second end for coupling to a second reference voltage, the reference capacitor 410 having a reference capacitance. The converter 402 may also include a switch capacitor arrangement 412 with a first end coupled to the first input of the amplifier 404, and a second end. The switch capacitor arrangement 412 may be configured to have a charge capacitance based on an analog charging voltage. The converter 404 may further include a switching mechanism 414 configured to switch the second end of the switch capacitor arrangement 412, between the second end of the sensor element 408a so that the switch capacitor arrangement 412 is in parallel connection with the sensor element 408a, and the second end of the reference capacitor 410 so that the switch capacitor arrangement 414 is in parallel connection with the reference capacitor 410. The switching may be based on the charge capacitance relative to the applied capacitance signal and the reference capacitance. The switching may adjust a first voltage signal at the first input of the amplifier relative to a second voltage signal at the second input of the amplifier 404, thereby adjusting the delta analog output voltage signal generated at the output.

The capacitance-to-voltage converter 402 may include a further feedback capacitor 406b with a first end coupled to the second input and a second end coupled to the output. The converter 402 may also include a further sensor element (hidden from view in FIG. 4) with a first end coupled to the second input of the amplifier 404, and a second end for coupling to the first reference voltage, the further sensor element for sensing the external input to generate a further applied capacitance signal. The converter 402 may further include the further reference capacitor with a first end coupled to the second input of the amplifier 404, and a second end for coupling to the second reference voltage, the further reference capacitor having the reference capacitance. The converter 402 may additionally include the further switch capacitor arrangement with a first end coupled to the second input of the amplifier 404, and a second end. The further switch capacitor arrangement may be configured to have a further charge capacitance based on a further analog charging voltage. The converter 402 may further include a further switching mechanism configured to switch the second end of the further switch capacitor arrangement, between the second end of the further sensor element so that the further switch capacitor arrangement is in parallel connection with the further sensor element, and the second end of the further reference capacitor so that the further switch capacitor arrangement is in parallel connection with the further reference capacitor. The switching may be based on the further charge capacitance relative to the applied capacitance signal and the reference capacitance. The switching may adjust the second voltage signal at the second input of the amplifier 404.

As highlighted above, the delta sigma modulator 400 may further include a resistor 428a connected in parallel to the feedback capacitor 406a. The resistance of the resistor 428a may be at least 1 giga-ohm. The delta sigma modulator 400 may further include a further resistor 428b connected in parallel to the further feedback capacitor 406b. The resistance of the further resistor 428b may be at least 1 giga-ohm.

In various embodiments, the differential amplifier 404 may be a fully differential amplifier. The output of the differential amplifier 404 may include the first output end and a second output end.

The second end of the feedback capacitor 406a may be coupled to the first output end. The first end of the feedback capacitor 406a may be coupled to the first input of the amplifier 404.

The second end of the further feedback capacitor 406b may be coupled to the second output end. The first end of the further feedback capacitor 406b may be coupled to the second input of the amplifier 404.

As highlighted above, the modulator 400 or converter 402 may include an output step-down chopper 426 connected to the first output end and the second output end of the fully differential amplifier 404. The output step-down chopper 426 may be configured to decrease a frequency of the delta analog output voltage signal.

The first switching circuit 422a may include the first step-up input chopper 424a, and the second step-up input chopper 424b. The modulator 400 or converter 402 may include the first step-up input chopper 424a connected to the second end of the sensor element 408a. The modulator 400 or converter 402 may also include a second step-up input chopper 424b connected to the second end of the reference capacitor 410. The first step-up input chopper 424a and the second step-up input chopper 424b may be configured to increase a frequency of the first voltage signal and a frequency of the second voltage signal. The first step-up input chopper 424a may be configured to increase a frequency of the first voltage signal. The second step-up input chopper 424b may be configured to increase a frequency of the second voltage signal. The first reference voltage may be provided by the first step-up input chopper 424a. The second reference voltage may be provided by the second step-up input chopper 424b. Each of the step-up input chopper 424a, 424b may be coupled to VDD and GND.

Similarly, the further switching circuit 422a may include a first further step-up input chopper 424a, and a second further step-up input chopper 424b. The modulator 400 or converter 402 may include a first further step-up input chopper connected to the second end of the further sensor element. The modulator 400 or converter 402 may also include a second further step-up input chopper 424b connected to the second end of the reference capacitor 410. The first step-up input chopper 424a and the second step-up input chopper 424b may be configured to increase a frequency of the first voltage signal and a frequency of the second voltage signal.

The modulator 400 or converter 402 may include an output step-down chopper 426 connected to the first output end and the second output end of the fully differential amplifier 404. The output step-down chopper 426 may be configured to decrease a frequency of the delta analog output voltage signal.

In various embodiments, the sensor element 408a may be in electrical connection with the further sensor element.

Figure 4B:
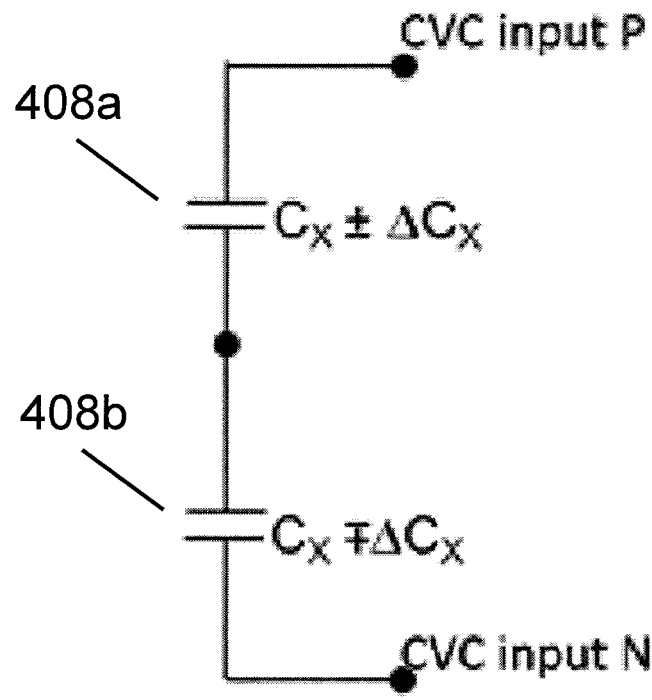
FIG. 4B illustrates the differential sensor according to various embodiments.

In various embodiments, the sensor element 408a and the further sensor element may be or may form a differential sensor. FIG. 4B illustrates the differential sensor according to various embodiments. The differential sensor may include the sensor element 408a and the further sensor element (denoted as 408b). The applied capacitance signal may have a static component and a dynamic component. The further applied capacitance signal may have a static component and a dynamic component. The static component ($C_x$) of the applied capacitance signal may substantially be equal to the static component ($C_x$) of the further applied capacitance signal. The dynamic component of the applied capacitance signal ($\Delta Cx$) may have an opposite polarity to the dynamic component of the further applied capacitance signal ($-\Delta Cx$).

For a differential sensor, the static capacitance in two branches (i.e. the sensor element and the further sensor element) may be substantially the same. However, the dynamic capacitance may change in a differential way. This implies that the sensor element 408a may have or generate a capacitance value of $Cx+\Delta Cx$ and the further sensor element 408b may have or generate a capacitance value of $Cx-\Delta Cx$.

Figure 4C:
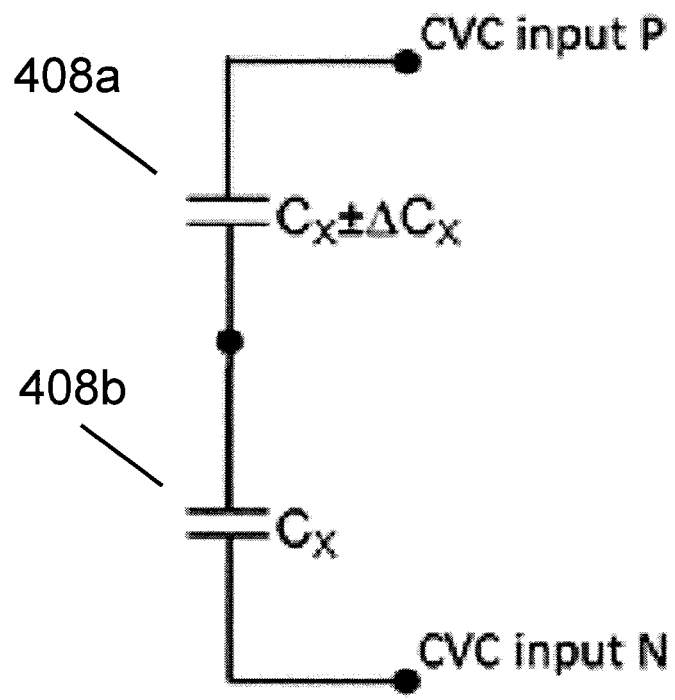
FIG. 4C illustrates the single ended or half bridge sensor according to various embodiments.

In various embodiments, the sensor element 408a and the further sensor element may be or may form a single ended or half bridge sensor. FIG. 4C illustrates the single ended or half bridge sensor according to various embodiments. The single ended or half bridge sensor may include the sensor element 408a and the further sensor element (denoted as 408b). The applied capacitance signal may have a static component and a dynamic component. The further applied capacitance signal may have a static component. The further applied capacitance signal may not have a dynamic component. The static component (Cx) of the applied capacitance signal may substantially be equal to the static component (Cx) of the further applied capacitance signal. The dynamic component of the applied capacitance signal ($\Delta Cx$) may vary between $-\Delta Cx$ and $+\Delta Cx$. For a single ended or half bridge sensor, the sensor element 408a may have or generate a capacitance value of $Cx \pm \Delta Cx$, while the further sensor element 408b may have or generate a capacitance value of Cx.

Figure 5A:
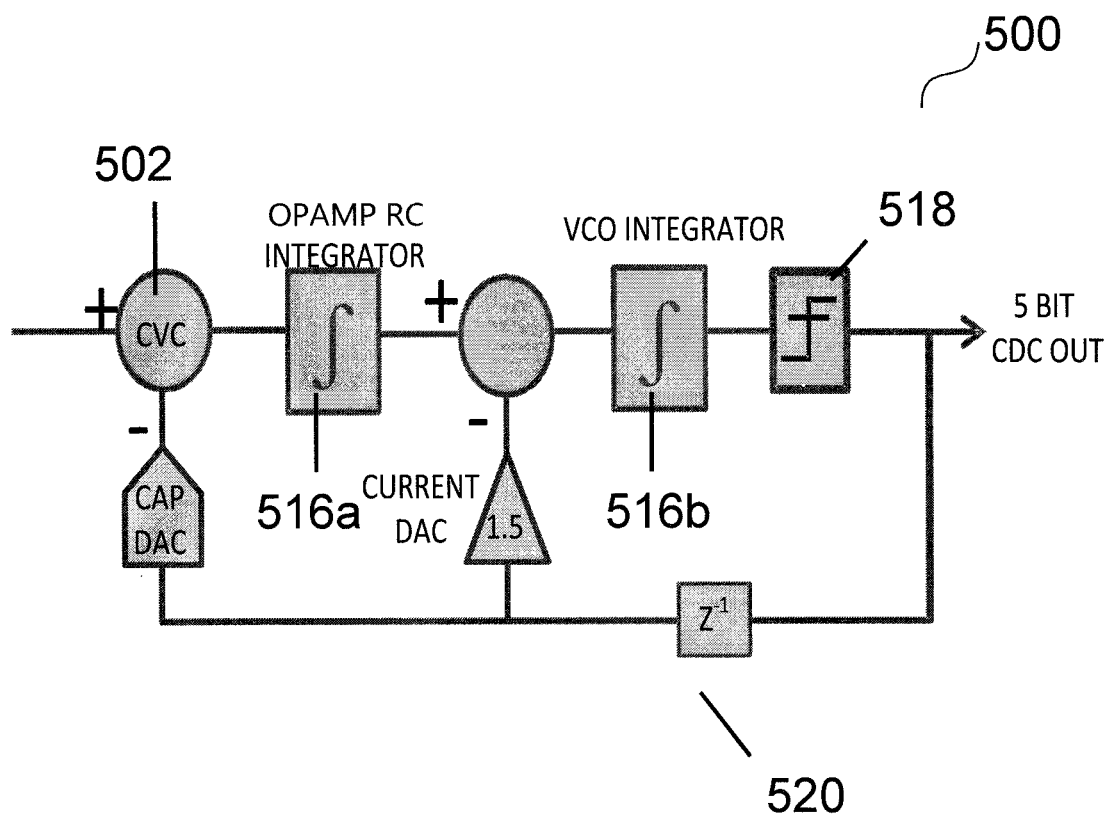
FIG. 5A is a schematic showing a second order capacitance-to-digital converter (CDC) according to various embodiments.
Figure 5B:
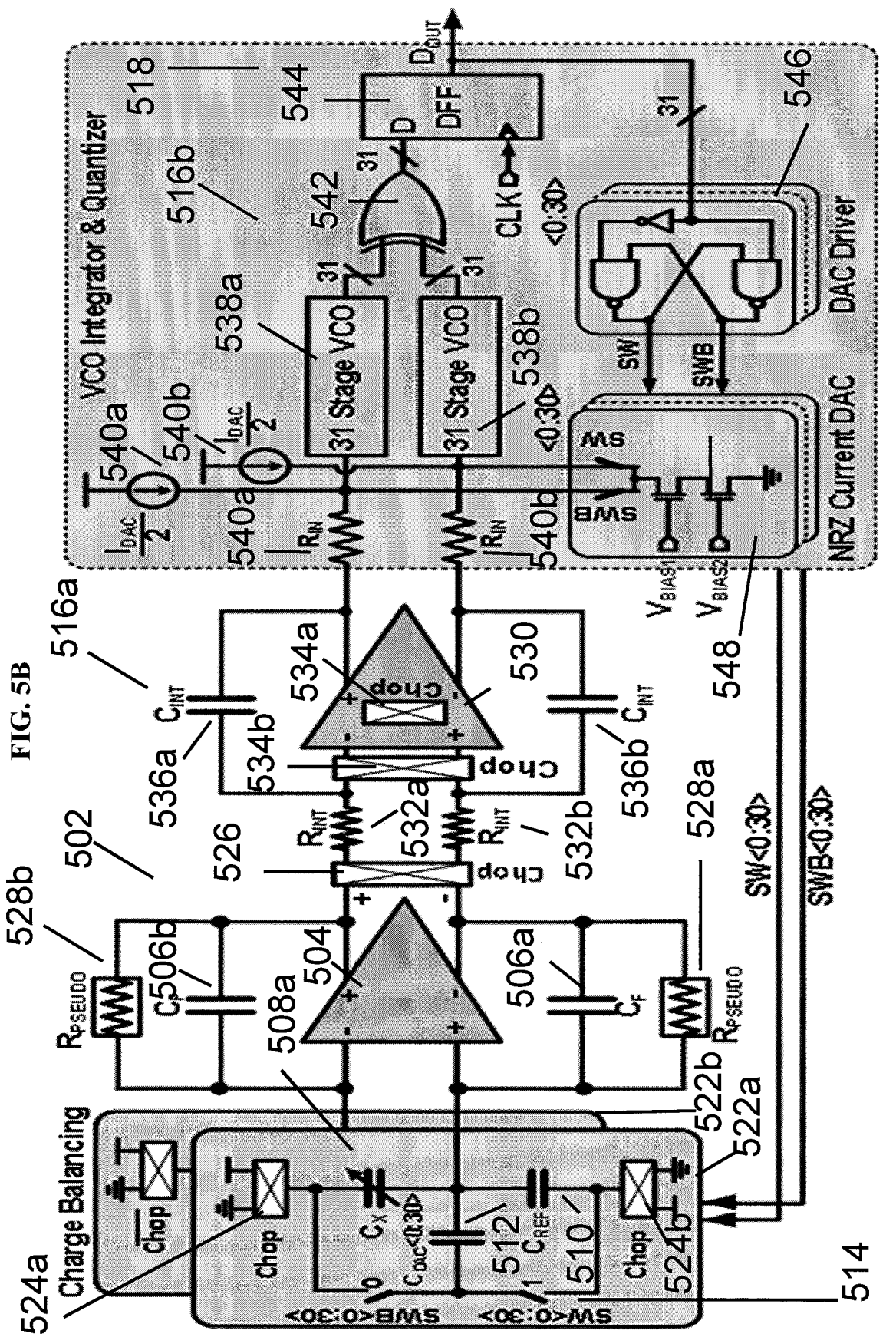
FIG. 5B is a schematic showing an exemplary implementation of the second order capacitance-to-digital (CDC) according to various embodiments.

FIG. 5A is a schematic showing a second order capacitance-to-digital converter (CDC) 500 according to various embodiments. FIG. 5A shows the architecture of the second order $\Delta\Sigma$ loop with the CVC 502 with the sensor embedded or included in the loop. FIG. 5B is a schematic showing an exemplary implementation of the second order capacitance-to-digital (CDC) 500 according to various embodiments.

A fully differential topology may be used. Two capacitive sensors i.e. first sensing capacitor 508a and second sensing capacitor (hidden from view in FIG. 5B), may be arranged in full bridge configuration, which may suppress or reduce supply noise or other common mode noise present in the system. The output of the CVC 502 may be equivalent to delta operation in ΔΣ loop as discussed before. The output of CVC 502 may be integrated using an operational amplifier resistor-capacitor (op-amp RC) integrator 516a. Voltage-controlled oscillator integrators (VCO-integrator) 538a, 538b may be used as the second integrator 516b. FIG. 5B shows two voltage-controlled oscillator integrators 516b. The phase of a VCO 538a, 538b may be proportional to the integral of its input.

Thus, each of the VCOs 538a, 538b may act as a linear integrator if the input to the VCO 538a, 538b is within a predetermined linear range of the VCO 538a, 538b. Comparing the phase outputs of both VCOs 538a, 538b may give integral of the input. Sampling this multi-phase output using a D-flip-flop (DFF) 518 may quantize the phase in time domain. A multi-bit non-zero return (NRZ) current digital-to-analog converter (DAC) 548 may be used in the feedback path. Multi-bit feedback may keep the input to each VCO 538a, 538b within the linear range of the VCO 538a, 538b. The 31-stage VCOs 538a, 538b may performs 5-bit quantization. The 5-bit quantized value may be used in capacitive feedback as well. While FIG. 5B shows 31 stages, 31 lines, i.e. <0:30>, and 31 capacitors in each capacitor bank $C_{DAC}$ 512, the number of stages, lines and capacitors in each capacitor bank $C_{DAC}$ may vary in various other embodiments. The number may be provided by $2^n-1$, where n is the quantization resolution. This may reduce the swing at the output of CVC and may help reduce power consumption of the op-amp 504. The output of the VCO-based integrator 516b may be inherently clocked level averaged (CLA), which is one form of Dynamic Element Matching (DEM) technique. The CLA output of the VCO-based integrator 516b may modulate any nonlinearity arising from DAC mismatches around twice the center frequency of the VCO-based integrator 516b. The op-amp RC integrator 516a may use chopping to minimize its flicker noise contribution. The high loop gain may provide first order shaping for the noise contribution from the VCO-based integrator 516b, obviating the need for any additional noise reduction techniques.

In various embodiments, the second order capacitance-to-digital converter (CDC) or delta sigma modulator 500 may include a capacitance-to-voltage converter 502 similar to the capacitance-to-voltage converter 502 shown in FIG. 4A. The converter 502 may include an amplifier 504, a first switching circuit 522a coupled to a first input of the amplifier 504, and a second switching circuit 522b coupled to a second input of the amplifier 504. The components of the second switching circuit 522b are hidden from view in FIG. 5B. Each switching circuit 522a, 522b may include a sensor element e.g. 508a, a reference capacitor 510, a switch capacitor arrangement 512, e.g. capacitor bank 512 including a plurality of capacitors, a switching mechanism e.g. 514 including one, two or more switches, a first step-up input chopper e.g. 528a, and a second step-up input chopper e.g. 528b. Feedback capacitor 506a and resistor 528a may be coupled in parallel from the first input to the first output end of the amplifier 504. Further feedback capacitor 506b and further resistor 528b may be coupled in parallel from the second input to the second output end of the amplifier 504. The second order capacitance-to-digital converter 500 may also include an output step-down chopper 526 coupled to the first output end of the amplifier 504 and the second output end of the amplifier 504.

In various embodiments, the second order capacitance-to-digital converter (CDC) or delta sigma modulator 500 may include may include an integrator circuit arrangement or integrator. The integrator circuit arrangement or integrator may include the first integrator stage 516a and the second integrator stage 516b. The first integrator stage 516a may include an operational amplifier 530. The operational amplifier 530 may include a first input coupled to the output step-down chopper 526 via resistor ($R_{INT}$) 532a, and a second input coupled to the output step-down chopper 526 via resistor ($R_{INT}$) 532b. The operational amplifier 530 may also include a chopper 534a. The first integrator stage 516a may also include an input chopper 534b, which may couple the resistors 532a, 532b to the operational amplifier 530. The operational amplifier 530 may further include a first output end, which may be coupled to the first input via capacitor ($C_{INT}$) 536a, and a second output end, which may be coupled to the second input via capacitor ($C_{INT}$) 536b.

The second integrator stage 516b may be coupled to the first integrator stage 516a. The second integrator stage 516b or CDC 500 may include a first voltage-controlled oscillator (VCO) 538a and a second voltage-controlled oscillator (VCO) 538b. The first VCO 538a and the second VCO 538b may each be a 31-stage VCO. The first VCO 538a may be coupled to the first output end of the operational amplifier 530 via resistor ($R_{IN}$) 540a. The second VCO 538b may be coupled to the second output end of the operational amplifier 530 via resistor ($R_{IN}$) 540b. The first VCO 538a may be coupled to current source 540a, and the second VCO 538b may be coupled to current source 540b.

The second integrator stage 516b or CDC 500 may include an exclusive OR gate (XOR) gate 542. The XOR gate 542 may be coupled to the first VCO 538a and the second VCO 538b. The output of the first VCO 538a and output of the second VCO 538b may be provided to inputs of the XOR gate 542.

In various embodiments, the second order capacitance-to-digital converter (CDC) or delta sigma modulator 500 may include a quantizer circuit arrangement or quantizer 518. In various embodiments, the quantizer circuit arrangement or quantizer 518 may be integrated with the second integrator stage 516b to form an integrated stage, or may be coupled to the second integrator stage 516b. The CDC 500 or quantizer circuit arrangement 518 may include a delay flip flop (DFF) 544. The XOR gate 542 may be coupled to the first VCO 538a and the second VCO 538b. The output of the first VCO 538a and the output of the second VCO 538b may be provided to inputs of the XOR gate 542. The XOR gate 542 may be coupled to delay flip flop (DFF) 544. The output of the XOR gate may be provided to DFF 544.

In various embodiments, the second order capacitance-to-digital converter (CDC) or delta sigma modulator 500 may include a digital-to-analog (DAC) converter 520. The digital-to-analog (DAC) converter 520 may include a digital-to-analog driver 546, which may include a first NAND gate and a second NAND gate. A non-zero return (NRZ) current digital-to-analog converter (DAC) 548 may be coupled to the digital-to-analog driver 546. The non-zero return (NRZ) current digital-to-analog converter (DAC) 548 may be coupled to the first VCO 538a and the second VCO 538b, and may include a first transistor and a second transistor. As shown in FIG. 5B, the SWB line may couple the converter 548 to the first VCO 538a and the current source 540a, while the SW line may couple the converter 548 to the second VCO 538b and the current source 540b. The converter 520 may also be coupled to the capacitance-to-voltage converter 502.

The architecture proposed may also be implemented in various other ways. For instance, the implementation shown in FIG. 5B uses VCOs 538a, 538b as quantizer to yield a 5-bit output. However, any number of bits may be used. Similarly, any type of quantizers such as flash, successive approximation register (SAR) or simple comparator for single bit quantizer may be used. The choice of quantizer may be decided based on the requirement.

Also, FIG. 5B shows a second order delta-sigma modulator 500 with an oversampling ratio of about 125. Based on the resolution required, the order and/or oversampling ratio may be varied.

Figure 5C:
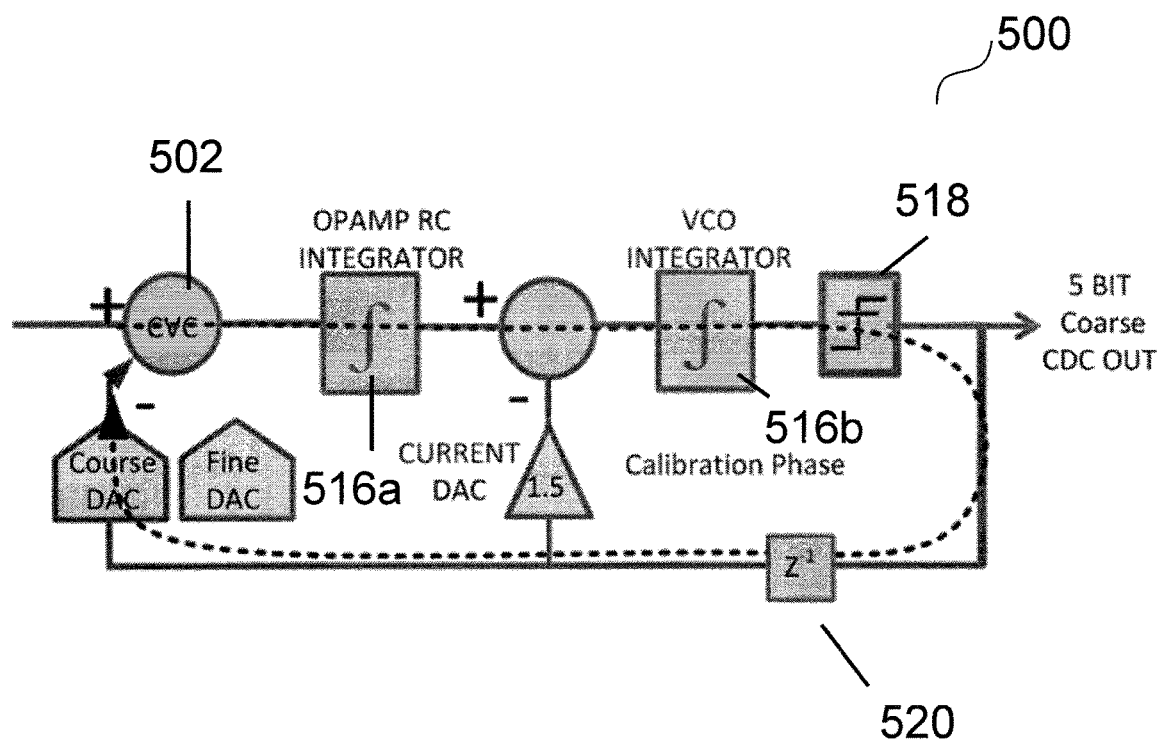
FIG. 5C illustrates the capacitance-to-digital converter (CDC) according to various embodiments in calibration phase.

Calculating baseline value of capacitance may be important in sensory applications where manufacturing process variations and other parasitic capacitances may drift or vary the value from a desired value. For a multi-bit quantizer, a coarse feedback may be used during the calibration phase that sets the coarse value of the baseline capacitance. FIG. 5C illustrates the capacitance-to-digital converter (CDC) 500 according to various embodiments in calibration phase.

Figure 5D:
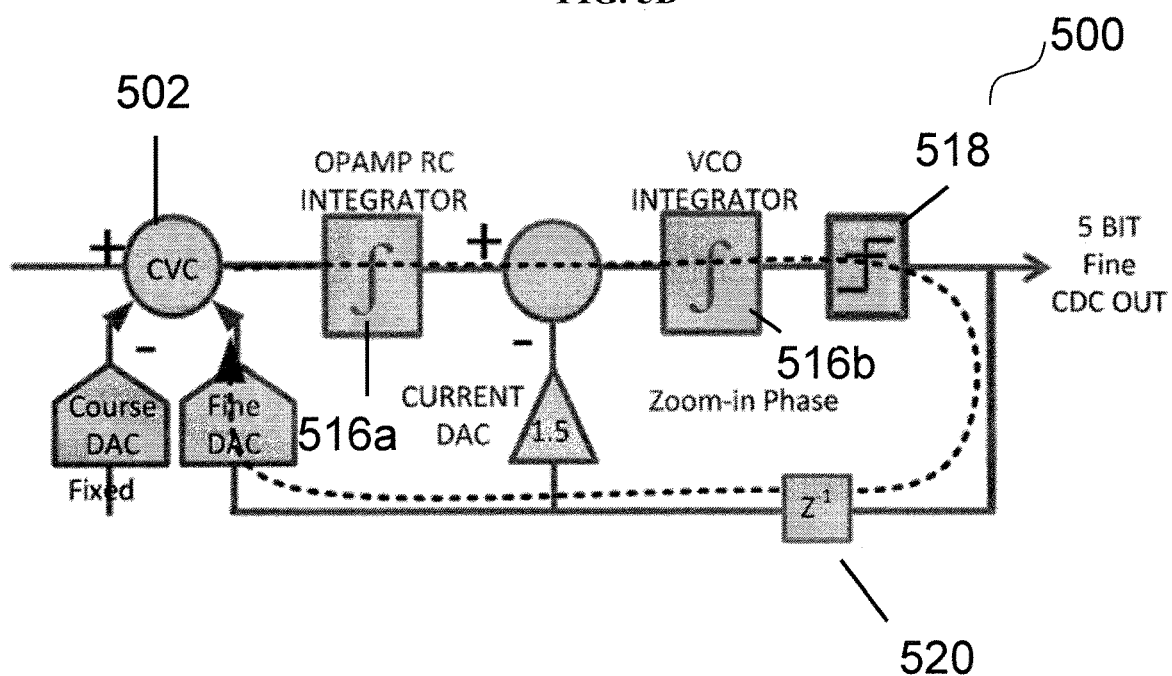
FIG. 5D illustrates the capacitance-to-digital converter (CDC) according to various embodiments in zoom-in phase.

Once the coarse value is set, the CDC 500 may continue regular operation with fine value of capacitors for feedback DAC. A similar approach may be used for implementing zoom-in CDC. FIG. 5D illustrates the capacitance-to-digital converter (CDC) 500 according to various embodiments in zoom-in phase.

In various embodiments, a full bridge configuration may be used for the sensor elements or sensing capacitors. In various other embodiments, the sensor elements or sensing capacitors may be arranged in half-bridge configuration in FIG. 4C to form a single ended or half-bridge sensor. The sensor may alternatively be a differential sensor as shown in FIG. 4B.

In the architecture, the sensing capacitors and feedback DAC may be connected to either VDD or GND, and may be excited by direct current (DC) sources. However, other waveforms such as sinusoid, triangular or any other arbitrary waveform may be used for excitation.

Various embodiments may be implemented in commercial 180 nm technology. Simulation has been carried out. Differential sinusoids have been used for testing and the CDC has been shown to achieve 14 bits effective number of bits (ENOB) for a power consumption of 48 uW by using a 1.2 V power supply. The CDC may use a sampling clock of 1 MHz and may sense from 0-10 pF capacitance with a resolution of 100 aF.

Figure 6:
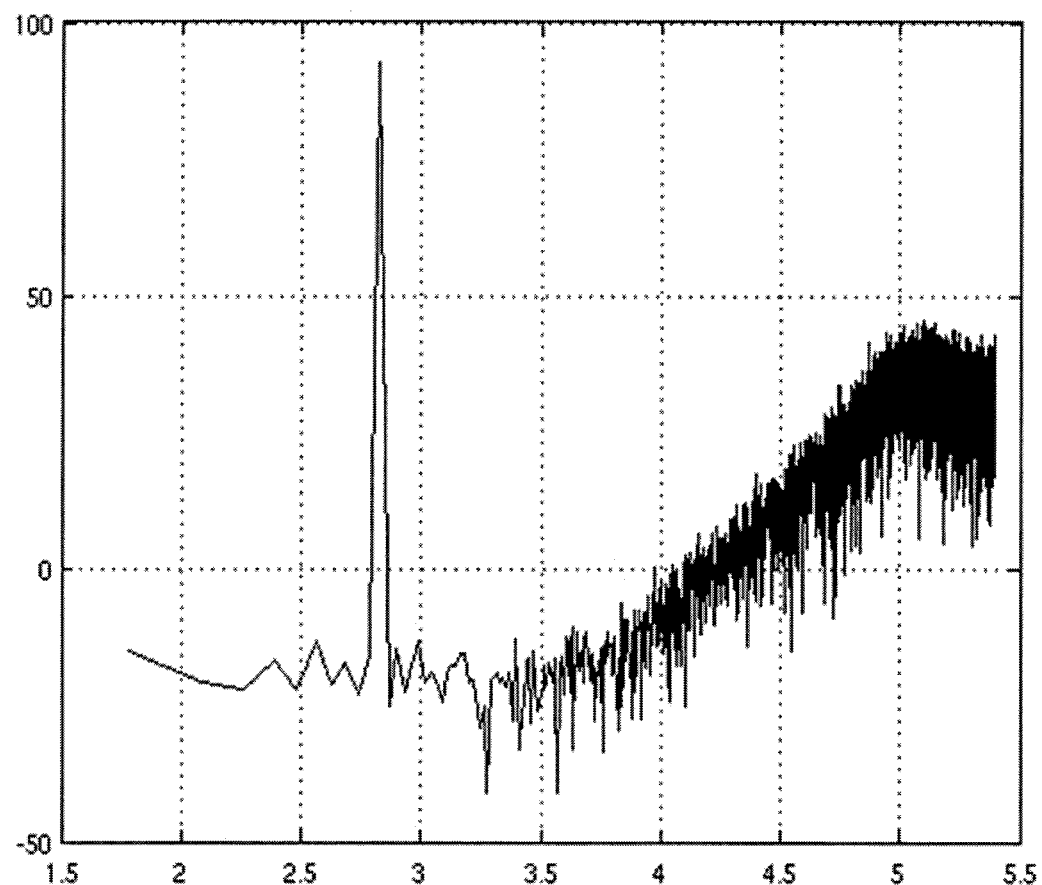
FIG. 6 is a plot of amplitude as a function of frequency (in kilohertz or kHz) showing the fast fourier transform (FFT) spectrum of the capacitance-to-digital converter (CDC) output according to various embodiments.

FIG. 6 is a plot 600 of amplitude as a function of frequency (in kilohertz or kHz) showing the fast fourier transform (FFT) spectrum of the capacitance-to-digital converter (CDC) output according to various embodiments. The varying input capacitance used to simulate FIG. 6 is in the form of a sinusoid. The sampling frequency is about 500 kHz and the bandwidth is 4 kHz. The CVC stage operational amplifier open loop (OL) gain is about 60 dB and the integrator operational amplifier open loop (OL) gain is about 60 dB. The VCO tuning coefficient is sampling frequency (Fs). The Signal-to-Noise Distortion Ratio (SNDR) is about 113 dB.

The advantages of various embodiments may include one or more of the following:

No noise folding: Since the input capacitance is not sampled there may be no noise folding at the input of the CDC. In the presence of chopping, noise present at the input may be dominated only by the thermal noise of the CVC op-amp. Noise from other circuit components may not be aliased. This may improve the resolution that could be achieved for a given amount of power when compared to switched capacitor implementation.

Power need not scale with performance: For a switched capacitor implementation increased oversampling (OSR) improves thermal (KTC) noise. However, increased OSR comes with a penalty in higher power consumption as op-amp settling time, and other delays have to be optimized for a given sampling frequency. In various embodiments, OSR may have no effect in the total input referred (KTC) noise of the system. Thus, OSR may be freely chosen based on the quantization noise requirements.

Large sensing capacitors and associated parasitics may not be charged and discharged at the rate of sampling frequency, which may improve energy efficiency.

The multibit capacitive DAC may help to reduce the swing at the output of C-to-V stage, which may improve power efficiency.

Even though various embodiments may need one additional op-amp for CVC, the amount of power overhead added may be minimal because power consumption of the first stage is decided by the noise requirements of the system.

Figure 7:
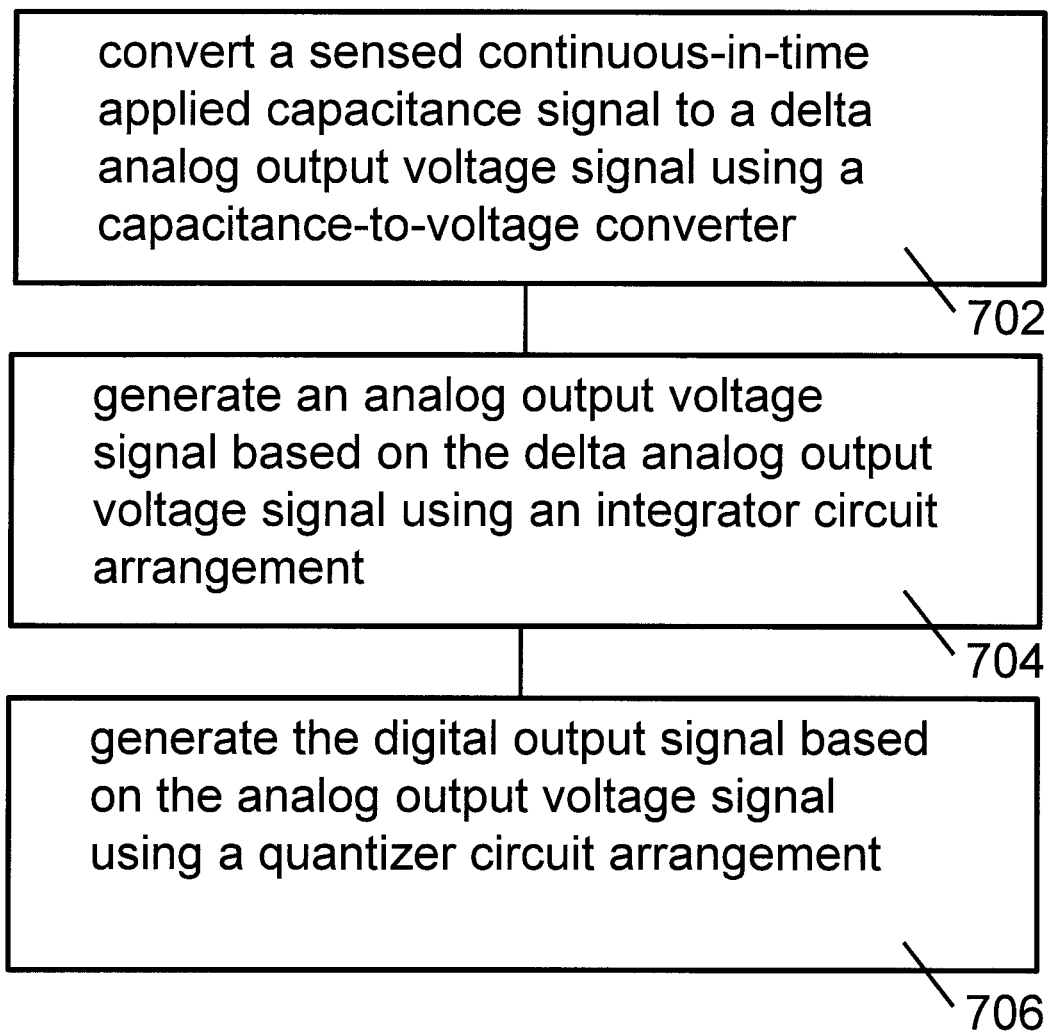
FIG. 7 is a schematic showing a method of generating a digital output voltage or a method of operating a delta sigma modulator according to various embodiments.

FIG. 7 is a schematic 700 showing a method of generating a digital output voltage or a method of operating a delta sigma modulator according to various embodiments. The method may include, in 702, converting a sensed continuous-in-time applied capacitance signal to a delta analog output voltage signal using a capacitance-to-voltage converter.

The converter may include an amplifier having a first input, a second input, and an output. The converter may also include a feedback capacitor with a first end coupled to the first input of the amplifier, and a second end coupled to the output. The converter may further include a sensor element with a first end coupled to the first input of the amplifier, and a second end for coupling to a first reference voltage, the sensor element for sensing an external input to generate the continuous-in-time applied capacitance signal. The converter may additionally include a reference capacitor with a first end coupled to the first input of the amplifier, and a second end for coupling to a second reference voltage, the reference capacitor having a reference capacitance. The converter may also include a switch capacitor arrangement with a first end coupled to the first input of the amplifier, and a second end, the switch capacitor arrangement configured to have a charge capacitance based on an analog charging voltage. The converter may further include a switching mechanism configured to switch the second end of the switch capacitor arrangement, between the second end of the sensor element so that the switch capacitor arrangement is in parallel connection with the sensor element, and the second end of the reference capacitor so that the switch capacitor arrangement is in parallel connection with the reference capacitor. The switching may be based on the charge capacitance relative to the applied capacitance and the reference capacitance. The switching may adjust a first voltage signal at the first input of the amplifier relative to a second voltage signal at the second input of the amplifier, thereby adjusting the delta analog output voltage signal generated at the output. The method may also include, in 704, generating an analog output voltage signal based on the delta analog output voltage signal using an integrator circuit arrangement. The method may additionally include, in 706, generating the digital output signal based on the analog output voltage signal using a quantizer circuit arrangement. The analog charging voltage may be generated based on the digital output signal using a voltage digital-to-analog converter, thereby generating the delta analog output voltage signal based on the digital output signal.

In other words, the capacitance-to-voltage converter may generate a delta analog output voltage signal. The integrator circuit arrangement may generate an analog output voltage signal based on the delta analog output voltage signal. The quantizer circuit arrangement may generate the digital output signal based on the analog output voltage signal using a quantizer circuit arrangement. There may also be a feedback loop including a voltage digital-to-analog converter connecting the output of the quantizer circuit arrangement to the integrator circuit arrangement.

The sensor element and/or the further sensor element may be configured to generate the continuous-in-time applied capacitance signal based on a parameter of interest, such as a force or pressure applied to the sensor element and/or a force or pressure applied to the further sensor element. Other parameters may include a level of liquid detected by the sensor element(s), a humidity detected by the sensor element(s), or an acceleration detected by the sensor element(s) etc.

The method may further include calibrating the modulator. The method may further include determining a baseline voltage based on a coarse voltage digital-to-analog converter during calibration. The analog charging voltage may be further based on the base-line voltage generated by the coarse voltage digital-to-analog converter.

FIG. 8A is a table 800a comparing the performance parameters of the modulator according to various embodiments with the performance parameters of conventional devices.

The conventional devices are described in the following publications:
1. J. Wanyeong, J. Seokhyeon, O. Sechang, D. Sylvester, and D. Blaauw, "27.6 A 0.7 pF-to-10 nF fully digital capacitance-to-digital converter using iterative delay-chain discharge," in Solid-State Circuits Conference—(ISSCC), 2015 IEEE International, 2015, pp. 1-3.
2. O. Sechang, J. Wanyeong, Y. Kaiyuan, D. Blaauw, and D. Sylvester, "15.4b incremental sigma-delta capacitance-to-digital converter with zoom-in 9b asynchronous SAR," in VLSI Circuits Digest of Technical Papers, 2014 Symposium on, 2014, pp. 1-2.
3. H. Yuming, C. Zu-yao, L. Pakula, S. H. Shalmany, and M. Pertijs, "27.7 A 0.05 mm2 1V capacitance-to-digital converter based on period modulation," in Solid-State Circuits Conference—(ISSCC), 2015 IEEE International, 2015, pp. 1-3.
4. T. Zhichao, R. Daamen, A. Humbert, Y. V. Ponomarev, C. Youngcheol, and M. A. P. Pertijs, "A 1.2-V 8.3-nJ CMOS Humidity Sensor for RFID Applications," Solid-State Circuits, IEEE Journal of, vol. 48, pp. 2469-2477, 2013.
5. X. Sha, K. Makinwa, and S. Nihtianov, "A capacitance-to-digital converter for displacement sensing with 17b resolution and 20 μs conversion time," in Solid-State Circuits Conference Digest of Technical Papers (ISSCC), 2012 IEEE International, 2012, pp. 198-200.

FIG. 8B is another table 800b comparing the performance parameters of the modulator according to various embodiments with the performance parameters of conventional devices.

Various embodiments may provide a modulator including a continuous time CVC in a closed loop sigma delta. Various embodiments may provide a CVC, which may alleviate the need for charging and discharging of the sensing capacitor(s). Various embodiments may provide a charge balancing scheme to the capacitance-to-voltage (C-to-V) input using feedback digital-to-analog (DAC).

In various embodiments, the CVC may be embedded in a sigma delta loop to improve energy efficiency. The sigma delta loop may be continuous time (CT) or hybrid.

An open loop C-to-V stage followed by digital conversion may be energy inefficient. The switched capacitor delta sigma CDCs are popular. However, the energy efficiency may be limited by thermal noise folding and bandwidth requirements of loop filter, and the need to charge and discharge the sensor capacitor at the rate of sampling.

The abovementioned issues may be mitigated by using a continuous time solution. Various embodiments may be analogous to continuous time sigma delta architecture for ADCs. The capacitive information may be converted to charge/voltage in the C-to-V stage.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:
1. A delta sigma modulator for generating a digital output voltage, the modulator comprising:
   a capacitance-to-voltage converter for converting a sensed continuous-in-time applied capacitance signal to a delta analog output voltage signal, the converter comprising:
      an amplifier having a first input, a second input, and an output;
      a feedback capacitor with a first end coupled to the first input of the amplifier, and a second end coupled to the output;
      a sensor element with a first end coupled to the first input of the amplifier, and a second end for coupling to a first reference voltage, the sensor element for sensing an external input to generate the continuous-in-time applied capacitance signal;
      a reference capacitor with a first end coupled to the first input of the amplifier, and a second end for coupling to a second reference voltage, the reference capacitor having a reference capacitance;
      a switch capacitor arrangement with a first end coupled to the first input of the amplifier, and a second end, the switch capacitor arrangement configured to have a charge capacitance based on an analog charging voltage; and
      a switching mechanism configured to switch the second end of the switch capacitor arrangement, between the second end of the sensor element so that the switch capacitor arrangement is in parallel connection with the sensor element, and the second end of the reference capacitor so that the switch capacitor arrangement is in parallel connection with the reference capacitor, wherein the switching is based on the charge capacitance relative to the applied capacitance signal and the reference capacitance, and wherein the switching adjusts a first voltage signal at the first input of the amplifier relative to a second voltage signal at the second input of the amplifier, thereby adjusting the delta analog output voltage signal generated at the output;
   an integrator circuit arrangement connected to the capacitance-to-voltage converter, the integrator circuit arrangement configured to generate an analog output voltage signal based on the delta analog output voltage signal;

a quantizer circuit arrangement configured to generate the digital output signal based on the analog output voltage signal; and a voltage digital-to-analog converter configured to generate the analog charging voltage based on the digital output signal, thereby generating the delta analog output voltage signal based on the digital output signal.

2. The delta sigma modulator according to claim 1,
wherein the second input of the amplifier is configured to receive a common mode voltage.

3. The delta sigma modulator according to claim 1,
wherein the capacitance-to-voltage converter comprises:
a further feedback capacitor with a first end coupled to the second input and a second end coupled to the output;
a further sensor element with a first end coupled to the second input of the amplifier, and a second end for coupling to the first reference voltage, the further sensor element for sensing the external input to generate a further applied capacitance signal;
a further reference capacitor with a first end coupled to the second input of the amplifier, and a second end for coupling to the second reference voltage, the further reference capacitor having the reference capacitance;
a further switch capacitor arrangement with a first end coupled to the second input of the amplifier, and a second end, the further switch capacitor arrangement configured to have a further charge capacitance based on a further analog charging voltage; and
a further switching mechanism configured to switch the second end of the further switch capacitor arrangement, between the second end of the further sensor element so that the further switch capacitor arrangement is in parallel connection with the further sensor element, and the second end of the further reference capacitor so that the further switch capacitor arrangement is in parallel connection with the further reference capacitor, wherein the switching is based on the further charge capacitance relative to the further applied capacitance signal and the reference capacitance, and wherein the switching adjusts the second voltage signal at the second input of the amplifier.

4. The delta sigma modulator according to claim 1, further comprising:
a resistor connected in parallel to the feedback capacitor;
wherein the resistance of the resistor is at least 1 giga-ohm.

5. The delta sigma modulator according to claim 1,
wherein the amplifier is a fully differential amplifier; and
wherein the output of the amplifier comprises a first output end and a second output end.

6. The delta sigma modulator according to claim 5,
wherein the second end of the feedback capacitor is coupled to the first output end.

7. The delta sigma modulator according to claim 5, further comprising
a further feedback capacitor with a first end coupled to the second input of the amplifier and a second end coupled to the second output end.

8. The delta sigma modulator according to claim 7, further comprising:
a further resistor connected in parallel to the further feedback capacitor;
wherein the resistance of the further resistor is at least 1 giga-ohm.

9. The delta sigma modulator according to claim 7, further comprising:
a first step-up input chopper connected to the second end of the sensor element; and
a second step-up input chopper connected to the second end of the reference capacitor;
wherein the first step-up input chopper and the second step-up input chopper are configured to increase a frequency of the first voltage signal and a frequency of the second voltage signal.

10. The delta sigma modulator according to claim 7, further comprising:
an output step-down chopper connected to the first output end and the second output end of the fully differential amplifier;
wherein the output step-down chopper is configured to decrease a frequency of the delta analog output voltage signal.

11. The delta sigma modulator according to claim 1,
wherein the integrator circuit arrangement comprises a first integrator stage and a second integrator stage; and
wherein the delta sigma modulator further comprises a current digital-to-analog converter configured to generate an analog current based on the digital output signal, the analog current signal for input to the second integrator stage.

12. The delta sigma modulator according to claim 11,
wherein the first integrator stage comprises an operational amplifier; and
wherein the second integrator stage comprises a voltage controlled oscillator.

13. The delta sigma modulator according to claim 1, further comprising:
a coarse voltage digital-to-analog converter for calibration of a baseline voltage;
wherein the coarse voltage digital-to-analog converter and the voltage digital-to-analog-converter are configured to generate the analog charging voltage based on the digital output signal.

14. The delta sigma modulator according to claim 1,
wherein the switch capacitor arrangement comprises one capacitor.

15. The delta sigma modulator according to claim 1,
wherein the switch capacitor arrangement comprises a plurality of capacitors connected in parallel to one another.

16. The delta sigma modulator according to claim 15,
wherein the switching mechanism is configured to connect the second ends of a first number of capacitors of the plurality of capacitors with the second end of the sensor element, and further configured to connect the second ends of a second number of capacitors of the plurality of capacitors to the reference capacitor, wherein the first number and the second number are based on the charge capacitance relative to the applied capacitance signal and the reference capacitance.

17. A method of generating a digital output voltage, the method comprising:
converting a sensed continuous-in-time applied capacitance signal to a delta analog output voltage signal using a capacitance-to-voltage converter, the converter comprising:
an amplifier having a first input, a second input, and an output;

a feedback capacitor with a first end coupled to the first input of the amplifier, and a second end coupled to the output;

a sensor element with a first end coupled to the first input of the amplifier, and a second end for coupling to a first reference voltage, the sensor element for sensing an external input to generate the continuous-in-time applied capacitance signal;

a reference capacitor with a first end coupled to the first input of the amplifier, and a second end for coupling to a second reference voltage, the reference capacitor having a reference capacitance;

a switch capacitor arrangement with a first end coupled to the first input of the amplifier, and a second end, the switch capacitor arrangement configured to have a charge capacitance based on an analog charging voltage; and a switching mechanism configured to switch the second end of the switch capacitor arrangement, between the second end of the sensor element so that the switch capacitor arrangement is in parallel connection with the sensor element, and the second end of the reference capacitor so that the switch capacitor arrangement is in parallel connection with the reference capacitor, wherein the switching is based on the charge capacitance relative to the applied capacitance signal and the reference capacitance, and wherein the switching adjusts a first voltage signal at the first input of the amplifier relative to a second voltage signal at the second input of the amplifier, thereby adjusting the delta analog output voltage signal generated at the output;

generating an analog output voltage signal based on the delta analog output voltage signal using an integrator circuit arrangement connected to the capacitance-to-voltage converter; and generating the digital output signal based on the analog output voltage signal using a quantizer circuit arrangement;

wherein the analog charging voltage is generated based on the digital output signal using a voltage digital-to-analog converter, thereby generating the delta analog output voltage signal based on the digital output signal.

18. The method according to claim 17,
wherein the sensor element is configured to generate the continuous-in-time applied capacitance signal based on a parameter of interest.

19. The method according to claim 17, further comprising:
determining a baseline voltage based on a coarse voltage digital-to-analog converter during calibration.

20. The method according to claim 19,
wherein the analog charging voltage is further based on the base-line voltage generated by the coarse voltage digital-to-analog converter.

* * * * *